United States Patent
Minsek et al.

(10) Patent No.: US 9,256,134 B2
(45) Date of Patent: *Feb. 9, 2016

(54) PHOTORESIST REMOVAL

(71) Applicant: ADVANCED TECHNOLOGY MATERIALS, INC., Danbury, CT (US)

(72) Inventors: David W. Minsek, New Milford, CT (US); Melissa K. Rath, Danbury, CT (US); David D. Bernhard, Kooskia, ID (US); Thomas H. Baum, New Fairfield, CT (US)

(73) Assignee: Advanced Technology Materials, Inc., Danbury, CT (US)

(*) Notice: Subject to any disclaimer, the term of this patent is extended or adjusted under 35 U.S.C. 154(b) by 0 days.

This patent is subject to a terminal disclaimer.

(21) Appl. No.: 14/224,656

(22) Filed: Mar. 25, 2014

(65) Prior Publication Data

US 2014/0213498 A1 Jul. 31, 2014

Related U.S. Application Data

(63) Continuation of application No. 13/568,790, filed on Aug. 7, 2012, now Pat. No. 8,679,734, which is a continuation of application No. 10/389,214, filed on Mar. 14, 2003, now Pat. No. 8,236,485.

(60) Provisional application No. 60/434,971, filed on Dec. 20, 2002.

(51) Int. Cl.

| | | |
|---|---|---|
| B08B 3/04 | (2006.01) |
| G03F 7/42 | (2006.01) |
| C11D 7/06 | (2006.01) |
| C11D 7/32 | (2006.01) |
| C11D 7/50 | (2006.01) |
| C11D 11/00 | (2006.01) |
| H01L 21/311 | (2006.01) |
| C11D 3/04 | (2006.01) |
| C11D 3/30 | (2006.01) |
| C11D 3/39 | (2006.01) |
| C11D 3/395 | (2006.01) |
| C11D 3/43 | (2006.01) |
| H01L 21/02 | (2006.01) |

(52) U.S. Cl.
CPC ............... *G03F 7/425* (2013.01); *C11D 3/044* (2013.01); *C11D 3/30* (2013.01); *C11D 3/3947* (2013.01); *C11D 3/3955* (2013.01); *C11D 3/3956* (2013.01); *C11D 3/43* (2013.01); *C11D 7/06* (2013.01); *C11D 7/3209* (2013.01); *C11D 7/50* (2013.01); *C11D 11/0047* (2013.01); *G03F 7/423* (2013.01); *H01L 21/31116* (2013.01); *H01L 21/31133* (2013.01); *H01L 21/02052* (2013.01); *Y10S 438/906* (2013.01)

(58) Field of Classification Search
None
See application file for complete search history.

(56) References Cited

U.S. PATENT DOCUMENTS

| | | | |
|---|---|---|---|
| 3,447,939 A * | 6/1969 | Johnson | 106/124.7 |
| 3,897,453 A | 7/1975 | Gante et al. | |
| 4,765,835 A | 8/1988 | Schoenhard | |
| 5,705,089 A | 1/1998 | Sugihara et al. | |
| 5,709,756 A | 1/1998 | Ward et al. | |
| 5,780,363 A | 7/1998 | Delehanty et al. | |
| 5,780,406 A | 7/1998 | Honda et al. | |
| 6,110,881 A | 8/2000 | Lee et al. | |
| 6,156,661 A | 12/2000 | Small | |
| 6,224,785 B1 | 5/2001 | Wojtczak et al. | |
| 6,242,400 B1 | 6/2001 | Lee | |
| 6,276,372 B1 | 8/2001 | Lee | |
| 6,306,807 B1 | 10/2001 | Wojtczak et al. | |
| 6,326,130 B1 | 12/2001 | Schwartzkopf et al. | |
| 6,447,563 B1 | 9/2002 | Mahulikar | |
| 6,599,370 B2 * | 7/2003 | Skee | 134/3 |
| 6,692,546 B2 | 2/2004 | Ma et al. | |
| 7,029,373 B2 | 4/2006 | Ma et al. | |
| 8,236,485 B2 * | 8/2012 | Minsek et al. | 430/329 |
| 8,679,734 B2 * | 3/2014 | Minsek et al. | 430/329 |
| 2002/0077259 A1 | 6/2002 | Skee | |
| 2002/0128164 A1 | 9/2002 | Hara et al. | |
| 2003/0176746 A1 | 9/2003 | Choudary et al. | |
| 2005/0026437 A1 | 2/2005 | Ma et al. | |

FOREIGN PATENT DOCUMENTS

| | | |
|---|---|---|
| EP | 0128014 B1 | 3/1988 |
| EP | 1049141 A1 | 11/2000 |
| WO | 9960448 A1 | 11/1999 |

OTHER PUBLICATIONS

Ito, H.; "Dissolution behavior of chemically amplified resist polymers for 248-, 193-, and 157-nm lithography," IBM, Journal of Research and Development, 2001, pp. 683-695, vol. 45.
Supplementary European Search Report, Feb. 12, 2010.
U.S. Appl. No. 60/386,800, filed Jun. 7, 2012.

* cited by examiner

Primary Examiner — Daborah Chacko Davis
(74) Attorney, Agent, or Firm — Tristan A. Fuierer; Moore & Van Allen, PLLC; Rosa Yaghmour

(57) ABSTRACT

Disclosed herein is a composition and method for semiconductor processing. In one embodiment, a wet-cleaning composition for removal of photoresist is provided. The composition comprises a strong base; an oxidant; and a polar solvent. In another embodiment, a method for removing photoresist is provided. The method comprises the steps of applying a wet-cleaning composition comprising about 0.1 to about 30 weight percent strong base; about one to about 30 weight percent oxidant; about 20 to about 95 weight percent polar solvent; and removing the photoresist.

16 Claims, No Drawings

PHOTORESIST REMOVAL

RELATED APPLICATION

This Application is filed under the provisions of 35 U.S.C. 111(a) and is a continuation of U.S. patent application Ser. No. 13/568,790 filed on Aug. 7, 2012, now U.S. Pat. No. 8,679,734 issued on Mar. 25, 2014, which is a continuation of U.S. patent application Ser. No. 10/389,214 filed on Mar. 14, 2003, now U.S. Pat. No. 8,236,485 issued on Aug. 7, 2012, which claims priority of U.S. Provisional App. Ser. No. 60/434,971, filed Dec. 20, 2012, all of which are hereby incorporated herein in their entireties.

FIELD OF THE INVENTION

The present invention relates to semiconductor processing and, more particularly, to photoresist removal.

BACKGROUND OF THE INVENTION

Integrated circuits are manufactured by a general sequence of steps wherein photoresist is coated onto a substrate, the photoresist layer is patterned by exposure and development, the pattern is transferred to the substrate, and the photoresist removed. This sequence of steps is repeated to build up multiple layers of patterned circuitry. For the photoresist removal step, plasma ashing is commonly used since etched photoresist residues may be difficult or impossible to remove using only wet cleaning, especially without damaging other materials that are present.

Positive photoresist is soluble in alkaline aqueous solutions as well as in compositions consisting of select organic and inorganic compounds. However, photoresist that has been exposed to a gas-phase plasma etch, such as a gas-phase plasma etch used for etching dielectric materials, will typically develop a hardened crust or residue, on the surface. The residue typically consists of cross-linked organic polymers, and may contain small amounts of silicon, metal, and halogen or other atoms.

Damascene or dual damascene processes commonly utilize a plasma etch such as that described above. The plasma etch may be a fluorine-based plasma etch to etch silicate-based interlayer dielectric (ILD) materials. These materials may include silicates, organosilicates and fluorosilicates. Fluorine-based plasma etching may cause fluorination of the cross-linked organic polymers that form the residue described above. This fluorination typically increases chemical resistance. Thus, the residue becomes difficult, if not impossible, to remove by conventional wet stripping techniques. Ashing using an oxidative or reductive plasma can remove the residue. However, plasma ashing is prone to damage to the ILD materials, especially low-k ILD materials.

Therefore, a need exists for photoresist removal that can remove photoresist residue but does not damage the ILD materials.

SUMMARY OF THE INVENTION

Disclosed herein is a composition and method for semiconductor processing. In one embodiment, a wet-cleaning composition for removal of photoresist is provided. The composition comprises a strong base; an oxidant; and a polar solvent. In another embodiment, a method for removing photoresist is provided. The method comprises the steps of (i) applying a wet-cleaning composition comprising about 0.1 to about 30 weight percent strong base, about one to about 30 weight percent oxidant, and about 20 to about 95 weight percent polar solvent; and (ii) removing the photoresist.

A more complete understanding of the present invention, as well as further features and advantages of the present invention, will be obtained by reference to the following detailed description and drawings.

DETAILED DESCRIPTION OF PREFERRED EMBODIMENTS

Disclosed herein is a composition and method for semiconductor processing. According to one aspect of the invention, a wet-cleaning composition for removal of photoresist is provided. The composition includes a strong base. For example, the strong base may yield a solution having a pH greater than about 11.5, even where the strong base makes up no more than about 3.5% of the solution. That is, the strong base may be no more than about 3.5 weight percent of the solution. However, as described further herein, higher strong base concentrations may be desirable. The strong base assists in the removal of the photoresist, e.g., unexposed positive photoresist. The composition also includes an oxidant and a polar solvent. Strong bases of the formula I, shown below, may be used in accordance with the teachings of the present invention.

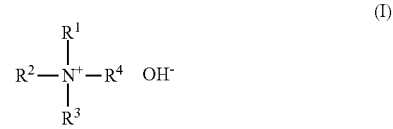

(I)

wherein $R^1$, $R^2$, $R^3$ and $R^4$ are each one of hydrogen, alkyl or substituted alkyl groups. Suitable strong bases include, but are not limited to, ammonium hydroxide, tetramethylammonium hydroxide (TMAH), choline hydroxide, as well as combinations comprising at least one of the foregoing strong bases. In an exemplary embodiment, the strong base comprises tetramethylammonium hydroxide.

The cleaning composition or solution described is particularly useful for cleaning photoresist residue from a semiconductor substrate. For example, in one embodiment, a semiconductor substrate is patterned to form trenches therein. This is done in a manner employing a photoresist. The photoresist and any residue may be removed from the trench and substrate with the described cleaning solution. A semiconductor feature such as a metal line may be formed in the trench followed by chemical mechanical planarazation to isolate the metal line. Further semiconductor processing may follow to form a completed semiconductor device.

In an exemplary embodiment, the composition of the present invention comprises greater than or equal to about 0.1 weight percent strong base, with greater than or equal to about one weight percent strong base preferred and greater than or equal to about five weight percent strong base more preferred. In the exemplary embodiment, the composition of the present invention further comprises less than or equal to about 30 weight percent strong base, with less than or equal to about 20 weight percent strong base preferred and less than or equal to about ten weight percent strong base more preferred.

The composition further comprises an oxidant. Suitable oxidants include, but are not limited to, inorganic oxidizers, organic oxidizers, e.g., amine-N-oxides, perborate salts, persulfate salts, percarbonate salts, as well as combinations comprising at least one of the foregoing oxidants. In an exemplary embodiment, the oxidant comprises organic oxidizers. Organic oxidizers of the general formula II, shown below, may be used in accordance with the teachings of the present invention.

wherein $R^1$, $R^2$ and $R^3$ may be hydrogen, methyl or further substituted or unsubstituted alkyl groups. $R^1$ and $R^2$ may form two ends of an alkyl chain.

While peroxides, e.g., hydrogen peroxide and substituted alkyl or aryl peroxides, may be used in accordance with the teachings of the present invention, amine-N-oxides have the advantage of being a more mild oxidant as compared to the peroxides in general. Further, amine-N-oxides decompose less rapidly as compared to peroxides in general. In particular, it is well-known that hydrogen peroxide in alkaline environments decomposes rapidly, yielding oxygen and water, a condition that leads to a short bath life especially at temperatures greater than ambient. Also, hydrogen peroxide may be unstable in the presence of oxidizable organic species, for example, amines and alcohols. Thus, in accordance with the teachings of the present invention, a non-peroxide oxidant is preferred.

In an exemplary embodiment, the composition of the present invention comprises greater than or equal to about one weight percent oxidant, with greater than or equal to about five weight percent oxidant preferred and greater than or equal to about ten weight percent oxidant more preferred. In the exemplary embodiment, the composition of the present invention further comprises less than or equal to about 30 weight percent oxidant, with less than or equal to about 20 weight percent oxidant preferred and less than or equal to about 15 weight percent oxidant more preferred.

The composition further comprises a polar solvent. The polar solvent solubilizes ionic components both in the photoresist and in the photoresist residues. Suitable polar solvent include, but are not limited to, water, ethylene, propylene, other glycol solvents, glycol ethers, alcohols, amides, carbonates, as well as combinations comprising at least one of the foregoing polar solvents. In an exemplary embodiment, the polar solvent comprises water due to its low cost and non-toxicity.

In an exemplary embodiment, the composition of the present invention comprises greater than or equal to about 20 weight percent polar solvent, with greater than or equal to about 30 weight percent polar solvent preferred and greater than or equal to about 40 weight percent polar solvent more preferred. In the exemplary embodiment, the composition of the present invention further comprises less than or equal to about 95 weight percent polar solvent, with less than or equal to about 85 weight percent polar solvent preferred and less than or equal to about 75 weight percent polar solvent more preferred.

The composition may further comprise a chelator. Suitable chelators include, but are not limited to, unsubstituted triazoles, substituted triazoles, thiazoles, tetrazoles, imidazoles, phosphates, thiols and azines, glycerols, amino acids, carboxylic acids, alcohols, amides, quinolines, as well as combinations comprising at least one of the foregoing chelators.

Unsubstituted triazoles include, but are not limited to, 1,2,3-triazole and 1,2,4-triazole. Further, triazoles may be substituted with alkyl groups, amino groups, benzo groups, thiol groups, mercapto groups, imino groups, carboxy groups, nitro groups, as well as combinations comprising at least one of the foregoing substituted groups. Substituted triazoles include, but are not limited to benzotriazole, polyltriazole, 5-phenyl-benzotriazole, 5-nitro-benzotriazole, 1-amino-1,2,3-triazole, 1-amino-1,2,4-triazole, 1-amino-5-methyl-1,2,3-triazole, hydroxybenzotriazole, 2-(5-amino-pentyl)-benzotriazole, 3-amino-1,2,4-triazole, 3-isopropyl-1,2,4-triazole, 3-mercapto-1,2,4-triazole, 5-phenylthiol-benzotriazole, halo-benzotriazoles, napthotriazole. Thiazoles, tetrazoles, imidazoles, phosphates, thiols and azines include, but are not limited to, 2-mercaptobenzoimidizole, 2-mercaptobenzothiazole, 5-aminotetrazole, 5-amino-1,3,4-thiadiazole-2-thiol, thiazole, triazine, methyltetrazole, 1,3-dimethyl-2-imidazolidinone, 1,5-pentamethylenetetrazole, 1-phenyl-5-mercaptotetrazole, diaminomethyltriazine, mercaptobenzothiazole, imidazoline thione, mercaptobenzoimidazole, 4-methyl-4H-1,2,4-triazole-3-thiol, benzothiazole, tritolyl phosphate, indiazole, as well as combinations comprising at least one of the foregoing. Glycerols, amino acids, carboxylic acids, alcohols, amides, quinolines include, but are not limited to, guanine, adenine, glycerol, thioglycerol, nitrilotriacetic acid, salicylamide, iminodiacetic acid, benzoguanamine, melamine, thiocyranuric acid, anthranilic acid, 8-hydroxyquinoline, 5-carboxylic acid-benzotriazolc, 3-mercaptopropanol, boric acid and iminodiacetic acid.

The chelator may be added to the composition to prevent the etching or corrosion of metal surfaces, e.g., copper, tungsten, aluminum and alloys thereof, exposed to the composition. As such, the chelator may be used to increase the compatibility of the composition with the metals and dielectric materials used in the semiconductor device.

In an exemplary embodiment, the composition of the present invention comprises less than or equal to about ten weight percent chelator, with less than or equal to about seven weight percent chelator preferred and less than or equal to about four weight percent chelator more preferred.

The composition may further comprise a co-solvent. The co-solvent may be added to improve compositional properties, namely the ability of the composition to swell, dissolve, and lift off photoresist residues. Suitable co-solvents include, but are not limited to, substituted alkylamines or alkanolamines such as N,N-dimethyldiglycolamine, 1,8-diazabicyclo [5.4.0]undecene, aminopropylmorpholine, triethanolamine, methylethanolamine, glycol solvents such as ethylene glycol, diethylene glycol, propylene glycol, neopentyl glycol, glycol ethers such as di(ethylene glycol)monoethyl ether, di(propylene glycol)propyl ether, ethylene glycol phenyl ether, di(propylene glycol) butyl ether, butyl carbitol, polyglycol ethers, as well as combinations comprising at least one of the foregoing co-solvents.

Further, the co-solvent should be polar. A polar compound will remain miscible with the polar solvent and will keep ionic species such as tetramethylammonium hydroxide dissolved. In an exemplary embodiment, the composition of the present invention comprises less than or equal to about 50 weight percent co-solvent, with less than or equal to about 30 weight percent co-solvent preferred and less than or equal to about 20 weight percent co-solvent more preferred.

The composition may further comprise a surfactant. The surfactant may be added in order to assist in both the lifting-off of insoluble photoresist residues and reduce silicon etching, which may occur under exposure to strong bases. Suitable surfactants include, but are not limited to, anionic, cationic, nonionic surfactants, such as fluoroalkyl surfactants, polyethylene glycols, polypropylene glycols, polyethylene or polypropylene glycol ethers, carboxylic acid salts, dodecylbenzenesulfonic acid or salts thereof, polyacrylate polymers, silicone or modified silicone polymers, acetylenic diols or modified acetylenic diols, alkylammonium or modified alkylammonium salts, as well as combinations comprising at least one of the foregoing surfactants.

In an exemplary embodiment, the composition of the present invention comprises less than or equal to about 20 weight percent surfactant, with less than or equal to about 15 weight percent surfactant preferred and less than or equal to about ten weight percent surfactant more preferred.

Another aspect of the invention provides a method for removing photoresist. The method comprises the steps of applying a wet-cleaning composition comprising about 0.1 to about 30 weight percent strong base; about one to about 30 weight percent oxidant; and about 20 to about 95 weight percent polar solvent; and removing the photoresist.

The term photoresist as used herein is generally applicable to any layer comprising photoresist. Thus, for example, in accordance with the teachings of the present invention, the composition and method herein may be used to remove photoresist as well as photoresist residue. Additionally, the teachings of the present invention apply to the removal of any photoresist residue, i.e., resulting from an etching process including, but not limited to, fluorine-based plasma etching.

Although illustrative embodiments of the present invention have been described herein, it is to be understood that the invention is not limited to those precise embodiments, and that various other changes and modifications may be effected therein by one skilled in the art without departing from the scope or spirit of the invention. The following examples are provided to illustrate the scope and spirit of the present invention. Because these examples are given for illustrative purposes only, the invention embodied therein should not be limited thereto.

EXAMPLES

The following formulations produced substantial cleaning of photoresist from a semiconductor substrate. Substantial cleaning, according to the teachings of the present invention, is defined as being greater than 80 percent removal of the photoresist from the semiconductor device, and may be determined by optical and electron microscopy. The substrate employed herein consisted of chemically amplified photoresist coated onto an organosilicate dielectric coated silicon wafer. Additionally, the photoresist was exposed to patterned radiation and developed, and the pattern was then transferred to the dielectric by a plasma etch.

Example 1

Composition A was prepared as follows:

| Composition A | |
| --- | --- |
| Component | Weight Percent |
| N-Methylmorpholine-N-oxide (50 weight percent solution) | 13.5 |
| TMAH (25 weight percent solution) | 7.3 |
| Water | 79.2 |

The N-methylmorpholine-N-oxide was supplied and used as a 50 weight percent solution, and tetramethylammonium hydroxide (TMAH) was supplied and used as a 25 weight percent solution in the present example, as well as in further examples employing N-methylmorpholine-N-oxide and tetramethylammonium hydroxide (TMAH).

A photoresist substrate was cleaned by immersion in composition A for 20 minutes at 70° C. All of the photoresist and etch residues were removed from the substrates as observed by optical and electron microscopy. Significant etching of the dielectric material was not observed.

Example 2

Compositions B, C and D were prepared, each containing 13.5 weight percent N-Methylmorpholine-N-oxide, 7.3 weight percent TMAH, 78.9 weight percent water and 0.3 weight percent of the inhibitor 2-mercaptobenzimidazole (2-MBI) as shown below. 2-MBI was included in the formulation in order to retard etching of copper or other metals by the solution, as may be seen in Example 3.

| Composition | Additive |
| --- | --- |
| B | 2,4-Diamino-6-methyl-1,3,5-triazine |
| C | 5-Amino-1,3,4-thiadiazole-2-thiol |
| D | 2-Mercaptobenzimidizole |

Photoresist substrates were cleaned by immersion in the stripper for 20 minutes at 70° C.

Example 3

Etch rates of a blanket coating of copper (Cu) on a silicon wafer were measured using compositions A through D, as prepared above. The copper layer was deposited by physical vapor deposition and was about 1000 angstroms (Å) in thickness. Samples were immersed in the composition for a fixed time, and the thickness was measured both before and after using four-point probe electrical measurements. Etch rates were calculated by dividing the difference in thickness, i.e., the thickness before etching, less the thickness after etching, by the time in minutes. The etch rates for compositions A through D are given below.

| Composition | Cu Etch Rate at 70° C. (Å/min) |
| --- | --- |
| A | 15.8 |
| B | 1.5 |
| C | 3.2 |
| D | 1.1 |

Example 4

Composition E was prepared as follows:

| Composition E | |
| --- | --- |
| Component | Weight Percent |
| N-Methylmorpholine-N-oxide (50 weight percent solution) | 13.5 |
| TMAH (25 weight percent solution) | 7.5 |
| 2-Mercaptobenzimidazole | 0.08 |
| Water | 64.1 |
| N,N-Dimethyldiglycolamine | 15.0 |
| polyethyleneglycol 4-nonylphenyl ether | 0.05 |

Polyethyleneglycol 4-nonylphenyl ether is a surfactant containing about 5 ethyleneglycol repeat units. After immersion in Composition E for 15 minutes at 70° C., there was 100 percent photoresist residue removal from all areas of the semiconductor.

Example 5

Composition F was prepared as follows:

| Composition F | |
| --- | --- |
| Component | Weight Percent |
| N-Methylmorpholine-N-oxide (50 weight percent solution) | 13.5 |
| TMAH (25 weight percent solution) | 6.5 |
| 2-Mercaptobenzimidizole | 0.01 |
| Water | 76.09 |
| Non-ionic fluorosurfactant | 0.1 |

The potential etching effects of compositions A and F on polysilicon were determined by immersing 1000 Å wafer sections of polysilicon on silicon, in each composition, for 15 minutes at 70° C. Composition F showed no observable etching or roughening of the polysilicon surface. Composition A did show slight observable roughening of the polysilicon surface.

Example 6

Composition G was prepared as follows:

| Composition G | |
| --- | --- |
| Component | Weight Percent |
| N-Methylmorpholine-N-oxide (50 weight percent solution) | 13.5 |
| TMAH (25 weight percent solution) | 6.5 |
| 2-Mercaptobenzimidizole | 0.01 |
| Water | 79.9 |
| modified acetylenic diol surfactant | 0.1 |

A photoresist substrate was cleaned by immersion in composition G for 20 minutes at 70° C. All of the photoresist and etch residues were removed from the substrates, as observed by optical and electron microscopy. However, etching or roughening of polysilicon was observed under the same conditions.

Example 7

Composition H was prepared as follows:

| Composition H | |
| --- | --- |
| Component | Weight Percent |
| N-Methylmorpholine-N-oxide (50 weight percent solution) | 13.5 |
| TMAH (25 weight percent solution) | 3.5 |

| Component | Weight Percent |
| --- | --- |
| 2-Mercaptobenzimidizole | 0.01 |
| Water | 82.89 |
| 2,4,7,9-tetramethyl-5-decyne-4,7-diol | 0.1 |

A polysilicon coated wafer, as described in Example 5, did not show observable etching or roughening when immersed in composition H for 15 minutes at 70° C. However, Composition H failed to remove the bulk of the photoresist crust from the substrate.

Example 8

Composition I was prepared as follows:

| Composition I | |
| --- | --- |
| Component | Weight Percent |
| N-Methylmorpholine-N-oxide (50 weight percent solution) | 13.5 |
| TMAH (25 weight percent solution) | 7.3 |
| 2-Mercaptobenzimidizole | 0.2 |
| Water | 43.9 |
| Non-ionic fluorosurfactant | 0.1 |
| Butyl carbitol | 5 |
| N,N-Dimethyldiglycolamine amine | 15 |
| 1,8-diazabicyclo [5.4.0] undecene | 15 |

Use of composition I showed removal of the photoresist with moderate protection of the polysilicon. Some etching or roughening was exhibited when the polysilicon was immersed in the sample for 15 minutes at 70° C. The copper etch rate remained low at 0.15 Å/minute and the tungsten etch rate was 0.67 Å/minute. The copper and tungsten samples were immersed for 40 minutes at 70° C.

Example 9

Composition J was prepared as follows:

| Composition J | |
| --- | --- |
| Component | Weight Percent |
| N-Methylmorpholine-N-oxide (50 weight percent solution) | 13.5 |
| TMAH (25 weight percent solution) | 7.3 |
| 2-Mercaptobenzimidizole | 0.2 |
| Water | 49 |
| Pentamethyldiethylenetriamine | 30 |

Composition J resulted in complete removal of photoresist and residues from the trench features and about 40 percent photoresist residue removal from the bond pad area. The trench features consisted of 1:1 line/space pairs of about 0.2 micron dimension, and the bond pad areas consisted of a square array of square dummy features of about 2 microns dimension.

Example 10

Composition K was prepared as follows:

| Composition K | |
| --- | --- |
| Component | Weight Percent |
| N-Methylmorpholine-N-oxide (50 weight percent solution) | 13.5 |
| TMAH (25 weight percent solution) | 7.3 |
| 2-Mercaptobenzimidizole | 0.2 |
| Water | 58.0 |

-continued

| Composition K | |
|---|---|
| Component | Weight Percent |
| Pentamethyldiethylenetriamine | 20.0 |
| Boric Acid | 1.0 |

Composition K resulted in some residual photoresist on the trench features with five percent of the bond pad area cleaned with immersion in composition K for 20 minutes at 70° C.

Example 11

Composition L was prepared as follows:

| Composition L | |
|---|---|
| Component | Weight Percent |
| N-Methylmorpholine-N-oxide (50 weight percent solution) | 13.5 |
| TMAH (25 weight percent solution) | 7.3 |
| 2-Mercaptobenzimidizole | 0.2 |
| Water | 49.0 |
| N-(3-Aminopropyl)-morpholine | 30.0 |

Composition L resulted in complete photoresist removal from the trench features and greater than 99.9 percent removal from the bond pad area when immersed for 16 minutes at 70° C.

Example 12

Composition M was prepared as follows:

| Composition M | |
|---|---|
| Component | Weight Percent |
| N-Methylmorpholine-N-oxide (50 weight percent solution) | 13.5 |
| TMAH (25 weight percent solution) | 7.3 |
| 2-Mercaptobenzimidizole | 0.2 |
| Water | 49.0 |
| N-Hydroxyethylmorpholine | 30.0 |

Composition M resulted in ten percent photoresist removal in the trench features and zero percent in the bond pad area when immersed for 16 minutes at 70° C.

Example 13

Composition N was prepared as follows:

| Composition N | |
|---|---|
| Component | Weight Percent |
| N-Methylmorpholine-N-oxide (50 weight percent solution) | 13.5 |
| TMAH (25 weight percent solution) | 7.3 |
| 2-Mercaptobenzimidizole | 0.08 |
| Water | 64.1 |
| N,N-Dimethyldiglycolamine amine | 15.0 |

Composition N resulted in complete photoresist crust removal from the trench features and 95 percent photoresist removal from the bond pad areas when immersed for 20 minutes at 70° C.

Example 13

Composition O was prepared as follows:

| Composition O | |
|---|---|
| Component | Weight Percent |
| N-Methylmorpholine-N-oxide (50 weight percent solution) | 12.6 |
| TMAH (25 weight percent solution) | 11.7 |
| 2-Mercaptobenzimidizole | 0.08 |
| Water | 75.3 |
| Polyethyleneglycol dinonylphenyl ether | 0.3 |

Polyethyleneglycol dinonylphenyl ether is a surfactant containing about 150 ethyleneglycol repeat units. Composition O resulted in complete photoresist crust removal from the trench features and complete percent photoresist removal from the bond pad areas when immersed for 20 minutes at 70° C.

Comparative Example 1

Comparative composition I consisted of ten weight percent hydroxylamine, ten weight percent water and 80 weight percent diglycolamine. Etched photoresist substrates were immersed in the composition for 30, 50 and 60 minutes at 70° C., followed by a rinsing with water. Inspection by optical and electron microscopy revealed that comparative composition I dissolved photoresist from under the top layer of photoresist residue, but left the layer of residue collapsed and attached to the samples in all regions.

We claim:
1. A cleaning solution comprising tetramethylammonium hydroxide, an amine-N-oxide, and a polar solvent, wherein said solution is useful for removing post-etch photoresist residue from a semiconductor substrate having same thereon.
2. The cleaning solution of claim 1, wherein the amount of each component is
    about 20 to about 95 wt % polar solvent;
    about 0.1 to about 30 wt % tetramethylammonium hydroxide; and
    about 1 to about 30 wt % amine-N-oxide.
3. The cleaning solution of claim 1, wherein said polar solvent comprises a polar species selected from the group consisting of water, an alcohol, ethylene glycol, propylene glycol, glycol ethers thereof, an amide, and a carbonate.
4. The cleaning solution of claim 1, wherein said polar solvent comprises water.
5. The cleaning solution of claim 1, wherein said amine-N-oxide has the formula:

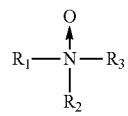

wherein $R_1$ and $R_2$ may be hydrogen, methyl, further substituted or unsubstituted alkyl groups or may form two ends of an alkyl chain, and R₃ may be methyl, further substituted or unsubstituted alkyl groups or may form two ends of an alkyl chain.

6. The cleaning solution of claim 1, wherein said amine-N-oxide comprises N-methylmorpholine-N-oxide.

7. The cleaning solution of claim 1, wherein the solution comprises water, N-methylmorpholine-N-oxide, and tetramethylammonium hydroxide.

8. The cleaning solution of claim 1, further comprising at least one chelator selected from the group consisting of 1,2,3-triazole, 1,2,4-triazole, benzotriazole, polyltriazole, 5-phenyl-benzotriazole, 5-nitro-benzotriazole, 1-amino-1,2,3-triazole, 1-amino-1,2,4-triazole, 1-amino-5-methyl-1,2,3-triazole, hydroxybenzotriazole, 2-(5-amino-pentyl)-benzotriazole, 3-amino-1,2,4-triazole, 3-isopropyl-1,2,4-triazole, 3-mercapto-1,2,4-triazole, 5-phenylthiol-benzotriazole, halo-benzotriazoles, napthotriazole, 2-mercaptobenzoimidizole, 2-mercaptobenzothiazole, 5-aminotetrazole, 5-amino-1,3,4-triadiazole-2-thiol, thiazole, triazine, methyltetrazole, 1,3-dimethyl-2-imidazolidinone, 1,5-pentamethylenetetrazole, 1-phenyl-5-mercaptotetrazole, diaminomethyltriazine, mercaptobenzothiazole, imidazoline thione, mercaptobenzoimidazole, 4-methyl-4H-1,2,4-triazole-3-thiol, benzothiazole, tritolyl phosphate, indiazole, guanine, adenine, glycerol, thioglycerol, nitrilotriacetic acid, salicylamide, iminodiacetic acid, benzoguanamine, melamine, thiocyranuric acid, anthranilic acid, 8-hydroxyquinoline, 5-carboxylic acid-benzotriazole, 3-mercaptopropanol, boric acid, and iminodiacetic acid.

9. The cleaning solution of claim 1, further comprising a co-solvent, wherein said co-solvent is one of an alkylamine, an alkanolamine, a glycol, and a glycol ether.

10. The cleaning solution of claim 9, wherein the co-solvent is selected from the group consisting of N,N-dimethyldiglycolamine, 1,8-diazabicyclo[5.4.0]undecene, aminopropylmorpholine, triethanolamine, methylethanolamine, ethylene glycol, diethylene glycol, propylene glycol, neopentyl glycol, di(ethylene glycol)monoethyl ether, di(propylene glycol)propyl ether, ethylene glycol phenyl ether, di(propylene glycol)butyl ether, di(ethylene glycol) monobutyl ether, polyglycol ethers, and combinations comprising at least one of the foregoing co-solvents.

11. The cleaning solution of claim 1, further comprising a surfactant.

12. A method to remove post-etching photoresist residue from a semiconductor substrate comprising contacting the semiconductor substrate with a cleaning solution for a sufficient amount of time to effect substantial cleaning of the semiconductor substrate, wherein the cleaning solution comprises tetramethylammonium hydroxide, an amine-N-oxide, and a polar solvent.

13. The method of claim 12, wherein said polar solvent comprises a polar species selected from the group consisting of water, an alcohol, ethylene glycol, propylene glycol, glycol ethers thereof, an amide, and a carbonate.

14. The method of claim 12, wherein said polar solvent comprises water.

15. The method of claim 12, wherein said amine-N-oxide has the formula:

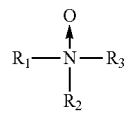

wherein R₁ and R₂ may be hydrogen, methyl, further substituted or unsubstituted alkyl groups or may form two ends of an alkyl chain, and R₃ may be methyl, further substituted or unsubstituted alkyl groups or may form two ends of an alkyl chain.

16. The method of claim 12, wherein said amine-N-oxide comprises N-methylmorpholine-N-oxide.

* * * * *